(12) United States Patent
Woodford et al.

(10) Patent No.: US 7,830,209 B1
(45) Date of Patent: Nov. 9, 2010

(54) SIGNAL LEVEL SELECTED EFFICIENCY IN A CHARGE PUMP POWER SUPPLY FOR A CONSUMER DEVICE AUDIO POWER OUTPUT STAGE

(75) Inventors: Scott Allan Woodford, Austin, TX (US); Daniel John Allen, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 12/355,839

(22) Filed: Jan. 19, 2009

(51) Int. Cl.
*H03F 3/04* (2006.01)

(52) U.S. Cl. ........................ 330/297; 330/279

(58) Field of Classification Search ............... 330/297, 330/285, 296, 279
See application file for complete search history.

(56) References Cited

U.S. PATENT DOCUMENTS

| | | | |
|---|---|---|---|
| 4,873,493 A | 10/1989 | Fuijiwara | |
| 5,289,137 A | 2/1994 | Nodar et al. | |
| 5,442,317 A | 8/1995 | Stengel | |
| 6,104,248 A | 8/2000 | Carver | |
| 6,304,138 B1 | 10/2001 | Johnson | |
| 6,586,992 B1 | 7/2003 | Strakovsky | |
| 6,636,103 B2 | 10/2003 | Wurcer et al. | |
| 7,031,457 B2 | 4/2006 | Melsa | |
| 7,166,992 B2 | 1/2007 | Kudo et al. | |
| 7,183,857 B2 | 2/2007 | Doy et al. | |
| 7,382,195 B2 * | 6/2008 | Chen et al. | 330/297 |
| 7,554,408 B2 * | 6/2009 | Chen et al. | 330/297 |
| 7,619,479 B2 * | 11/2009 | Azuhata et al. | 330/297 |
| 2008/0044041 A1 | 2/2008 | Tucker et al. | |
| 2008/0144861 A1 | 6/2008 | Melanson et al. | |

FOREIGN PATENT DOCUMENTS

| | | |
|---|---|---|
| DE | 19858963 A1 | 7/2000 |
| DE | 10140285 A1 | 2/2003 |
| GB | 2360410 A | 9/2001 |

OTHER PUBLICATIONS

Quilter, Patrick "Amplifier Anatomy", QSC Audio Products, published in Sound & Video Contractor Feb. 20, 1993.

* cited by examiner

*Primary Examiner*—Henry K Choe
(74) *Attorney, Agent, or Firm*—Andrew M. Harris; Mitch Harris, Atty at Law, LLC

(57) ABSTRACT

A charge pump power supply for a consumer device audio power stage has an efficiency selected according to signal level. The frequency of operation of the charge pump and/or the effective size of a switching transistor bank is adjusted based upon a volume (gain) setting, or a detected signal level, so that internal power consumption of the charge pump is reduced when high output current is not required from the audio power stage and consequently from the charge pump. Operating modes of the charge pump are selected by the signal level indication and include at least a high power and a high efficiency mode selected by setting the charge pump operating frequency and/or enabling or disabling switching of one or more of multiple parallel transistors used to implement each switching element of the charge pump, thereby setting the level of gate capacitance being charged/discharged by the gate driver circuit(s).

20 Claims, 3 Drawing Sheets

SIGNAL LEVEL SELECTED EFFICIENCY IN A CHARGE PUMP POWER SUPPLY FOR A CONSUMER DEVICE AUDIO POWER OUTPUT STAGE

CROSS-REFERENCE TO RELATED APPLICATIONS

The present U.S. Patent Application is related to U.S. patent application Ser. No. 11/610,496 filed on Dec. 13, 2006, having at least one common inventor and assigned to the same Assignee, and which was published as U.S. Published Patent Application US2008/0044041. The disclosure of the above-referenced U.S. Patent Application is incorporated herein by reference.

BACKGROUND OF THE INVENTION

1. Field of the Invention

The present invention relates generally to consumer device audio power output stages, and more specifically, to a circuit that selects the efficiency of a charge-pump power supply supplying an audio amplifier based on signal level.

2. Background of the Invention

In battery-operated consumer audio devices, the power amplifier output, which is generally utilized to drive a pair of headphones or a speaker, can be the primary consumer of battery power. In devices having a linear power amplifier for the output stage, power is wasted during low signal level outputs, since the voltage drop across the active output transistor plus the output voltage will be equal to the constant power supply rail voltage. Therefore, amplifier topologies such as Class-G and Class-H are desirable for reducing the voltage drop across the output transistor(s) and thereby reducing the power wasted in dissipation by the output transistor(s).

In order to provide a changeable power supply voltage to such a power amplifier, a charge pump power supply may be used, such as that disclosed in the above-incorporated U.S. Patent Application, in which an indication of the signal level at the output of the circuit is used to control the power supply voltage. The above-described topology will raise the efficiency of the audio amplifier, in general, as long as periods of low signal level are present in the audio source. However, the charge pump itself may be a substantial consumer of power, in particular during low audio signal level operation as the relatively constant internal power consumption of the charge pump circuit becomes larger with respect to the power being delivered by the charge pump to the audio amplifier.

Therefore, it would be desirable to provide a charge-pump power supply that supplies power to an audio power amplifier circuit for a consumer audio device, in which the efficiency of the charge pump is improved.

SUMMARY OF THE INVENTION

Improved efficiency of a charge-pump power supply for a consumer device audio power output stage is achieved in a circuit and its method of operation.

The power amplifier circuit includes a charge pump power supply that has a selectable operating mode, so that in a first mode of operation, the charge pump has a high efficiency, and so that in a second mode, the charge pump has a high power output capability. The operating mode of the charge pump is selected in conformity with an indication of the amplitude of the signal being amplified by the amplifier, which may be determined from a volume (gain) control setting or by detecting an amplitude of the signal. Selection of the operating mode may select a frequency of operation of the charge pump, an effective size of the switching transistor(s) in the charge pump or a combination thereof. The effective size of the switching transistor(s) can be adjusted by using one or more switching transistor "banks" having at least two transistors having their drain and source terminals connected in parallel to implement each switching element, and disabling switching of the gate of one or more of the parallel transistors to reduce the total gate capacitance being charged and discharged by the gate driver circuit(s). More than two operating modes may be provided to provide multiple levels of efficiency vs. power output capability.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses an audio power amplifier stage for a consumer audio device, and a charge-pump power supply for supplying the power supply rails of at least the final power amplifier stage. The efficiency of the charge-pump power supply is selectable and is set in conformity with either an expected or actual signal level of the audio signal being amplified, so that at signal amplitudes that do not require the maximum output power, the efficiency of the charge-pump power supply is increased to conserve power.

Figure 1:
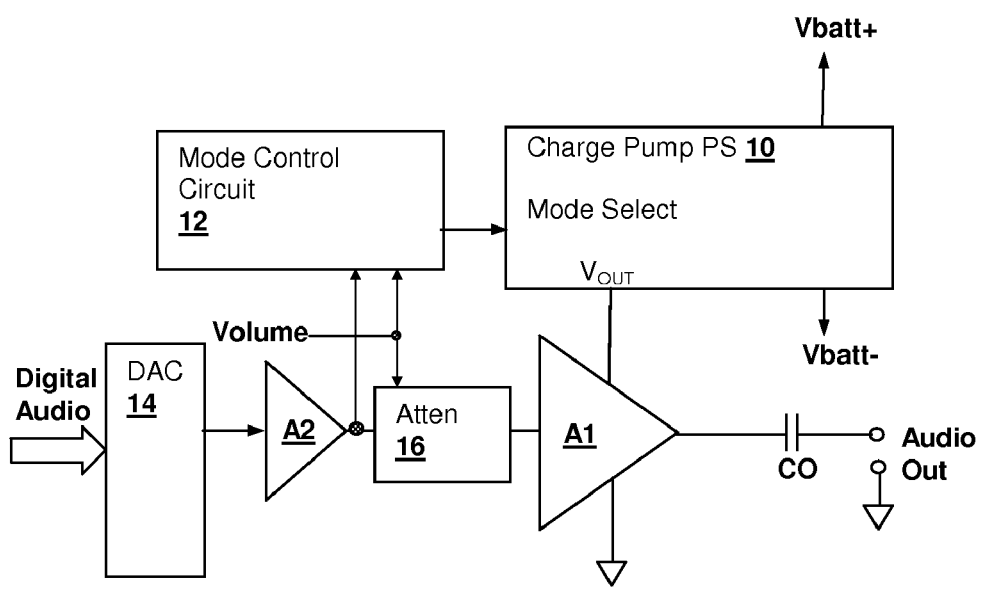
FIG. 1 is a schematic diagram depicting an audio output stage of a consumer audio device in accordance with an embodiment of the invention.

Referring now to FIG. 1, a consumer audio device audio output stage is depicted in accordance with an embodiment of the present invention. A digital-to-analog converter (DAC) 14 supplies an analog signal to a first amplifier stage A2 that is operated from a fixed voltage power supply. The input to DAC 14 is a digital audio source, but that is not a limitation of the present invention, as the techniques of the present invention may be applied to an audio amplifier having a purely analog signal path. The signal at the output of first amplifier stage A2 is provided to an attenuator 16 that receives a volume control signal and attenuates the signal accordingly. Attenuator 16 may be a digital potentiometer having control provided from a microcontroller or other digital control circuit responsive to a user interface, volume knob encoder or program command, or attenuator 16 may be an analog potentiometer that provides the volume control signal as an output indication from a secondary deck (separate potentiometer circuit coupled to the common shaft or other mechanism) for use in the power supply control algorithms described below. While an attenuator 16 is shown as the volume control mechanism, it is understood that an equivalent volume control may be provided by a programmable resistor or adjustable gain in the feedback of amplifier A2 or another amplifier stage in the signal path. A final power amplifier stage A2 amplifies the signal received from attenuator 16 and provides an audio output signal, which may operate a speaker, headphone transducer, and/or a line level signal output. A capacitor CO may be utilized to couple the output signal to the transducer or line level output, particularly if amplifier A1 is operated from a uni-polar power supply having a quiescent voltage substantially differing from ground.

The internal power consumption of charge pump power supply 10 increases with increasing size of the switching devices within charge pump power supply 10 and also with the frequency of switching, thereby decreasing the efficiency of charge pump power supply 10. The internal power consumption of charge pump power supply 10 due to charging and discharging the gates of the switching transistors can be expressed as $CV^2F_S$, where C is the total gate capacitance of the switching transistors being switched at each half-period of switching frequency $F_S$ and V is the voltage swing at the gates of the switching transistors. When power amplifier A1 is expected to provide a high level signal to output Audio Out, the output power requirements of charge pump power supply 10 are greater, requiring a larger transistor area and/or a higher switching frequency to avoid "droop" in charge pump power supply 10 output voltage $V_{OUT}$ that would otherwise occur due to a high drain-to-source resistance ($r_{DS}$) of the switching transistors and/or lower "charge pumping" rate of the charge pump. In a high power/lower efficiency mode of operation of charge pump power supply 10 according to the present invention, the effective area of switching transistors within charge pump power supply 10 is increased, the switching frequency is increased, or both techniques are applied to maintain the output voltage at required levels when expected or actual signal amplitudes at output Audio Out have a high amplitude. Output voltage $V_{OUT}$ of charge power supply 10 can also be increased according to the techniques disclosed in the above-incorporated U.S. Patent Application.

When only low signal levels are expected at amplifier output Audio Out, the efficiency of charge pump power supply 10 can be improved. In a lower power/higher efficiency mode of operation of charge pump power supply 10 according to the present invention, the effective area of switching transistors within charge pump power supply 10 is decreased, the switching frequency is decreased, or both techniques are applied to reduce the internal power consumption of charge pump power supply when expected or actual signal amplitudes at output Audio Out have a lower amplitude. Output voltage $V_{OUT}$ of charge power supply 10 can also be decreased in accordance with actual or expected signal level by using techniques such as those disclosed in the above-incorporated U.S. Patent Application, further improving the efficiency of the overall amplifier circuit.

In order to determine the expected signal amplitudes at amplifier output Audio Out, the volume control signal is also supplied to a mode control circuit 12 for controlling the efficiency of charge power supply 10, according to the expected amplitude of the output signal, since higher levels of attenuation or lower levels of gain in the audio signal path will reduce the volume of the signal being amplified and produced at amplifier output Audio Out. Alternatively, or in combination, the output of amplifier A2 is also provided to mode control circuit 12 so that actual signal levels can be measured by mode control circuit 12 and the efficiency of charge pump power supply 10 adjusted in conformity with the power requirements for the actual signal level that will be reproduced at amplifier output Audio Out. In the depicted embodiment, since the volume control is applied after the signal level measurement taken from the output of amplifier A2, the volume information is needed even if the signal level is detected by mode control circuit 12, since mode control circuit 12 must also receive information relating to the amount of gain/attenuation that will be applied to the signal prior to amplification by power amplifier A1.

Charge pump power supply 10 provides the power supply rail inputs of amplifier A1 and receives a power supply input, generally from a battery or other power supply, depicted as battery terminal connections Vbatt+ and Vbatt−. Mode control circuit 12 supplies a Mode Select signal to charge pump power supply 10 that selects an operating mode of charge pump power supply 10 as described above. Also, as mentioned above, charge pump power supply output voltage $V_{OUT}$ may be adjusted according to expected or actual audio signal levels at amplifier output Audio Out according to the techniques disclosed in the above-incorporated U.S. Patent Application.

Figure 2:
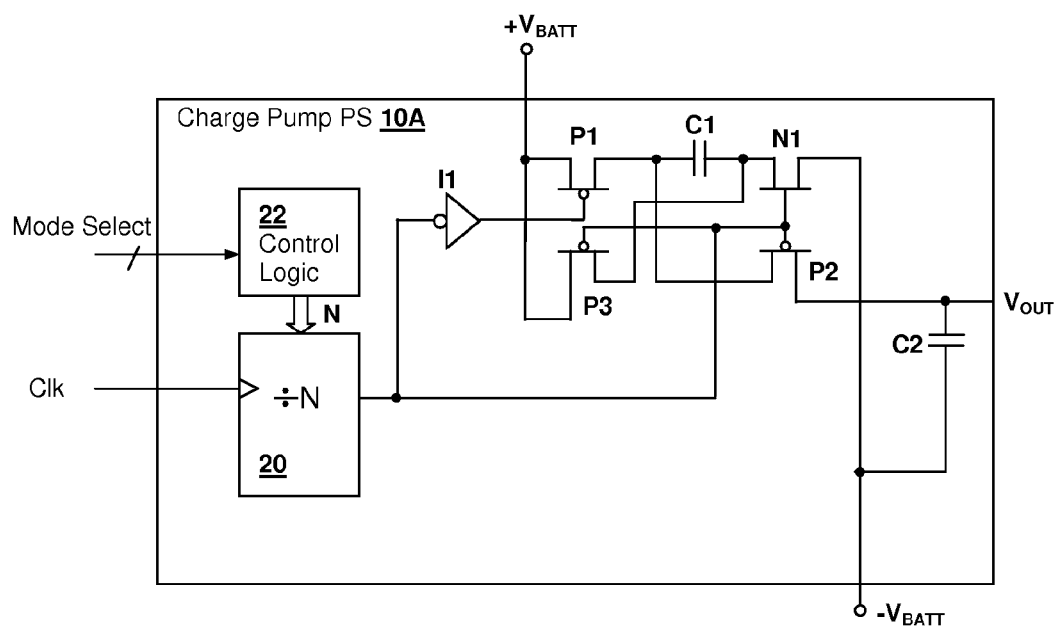
FIG. 2 is a schematic diagram depicting a charge-pump power supply 10A that may be used to implement charge-pump power supply 10 of FIG. 1, in accordance with an embodiment of the invention.

Referring now to FIG. 2, a schematic diagram of a charge pump power supply 10A that may be used to implement charge pump power supply 10 of FIG. 1 is shown. The illustrated charge pump circuit is a simple voltage doubler having a unipolar output for simplicity of illustration. However, it is understood that techniques according to the present invention may be applied to bipolar charge pumps and charge pumps having selectable output voltages, such as those disclosed in the above-incorporated U.S. Patent Application. Switching transistors P1 and N1 control the charging of a flying capacitor C1, which is applied between input terminals $+V_{BATT}$ and $-V_{BATT}$ during a first clock phase of an output provided by a frequency divider 20 that divides the frequency of an input clock Clk by a factor N. An inverter I1 supplies an inverted output of frequency divider 20 to provide the appropriate polarity of the output of frequency divider 20 to switching transistor P1. In a second phase of the output of frequency divider 20, switching transistors P2 and P3 are activated to dump the charge placed on flying capacitor C1 onto output capacitor C2, which during repeated periods of the output of frequency divider 20 will continue to charge output capacitor C2 up to a voltage approximately equal to twice the voltage between input terminals $+V_{BATT}$ and $-V_{BATT}$.

A control logic 22 receives one or more Mode Select signals and programs frequency divider 20 according to factor N, to set the switching frequency at the output of frequency divider 20, so that in one or more higher efficiency modes, the switching frequency is reduced (i.e., factor N is greater) and in a high power mode, factor N is a minimum and charge pump power supply 10A is operated at a maximum switching frequency.

Figure 3:
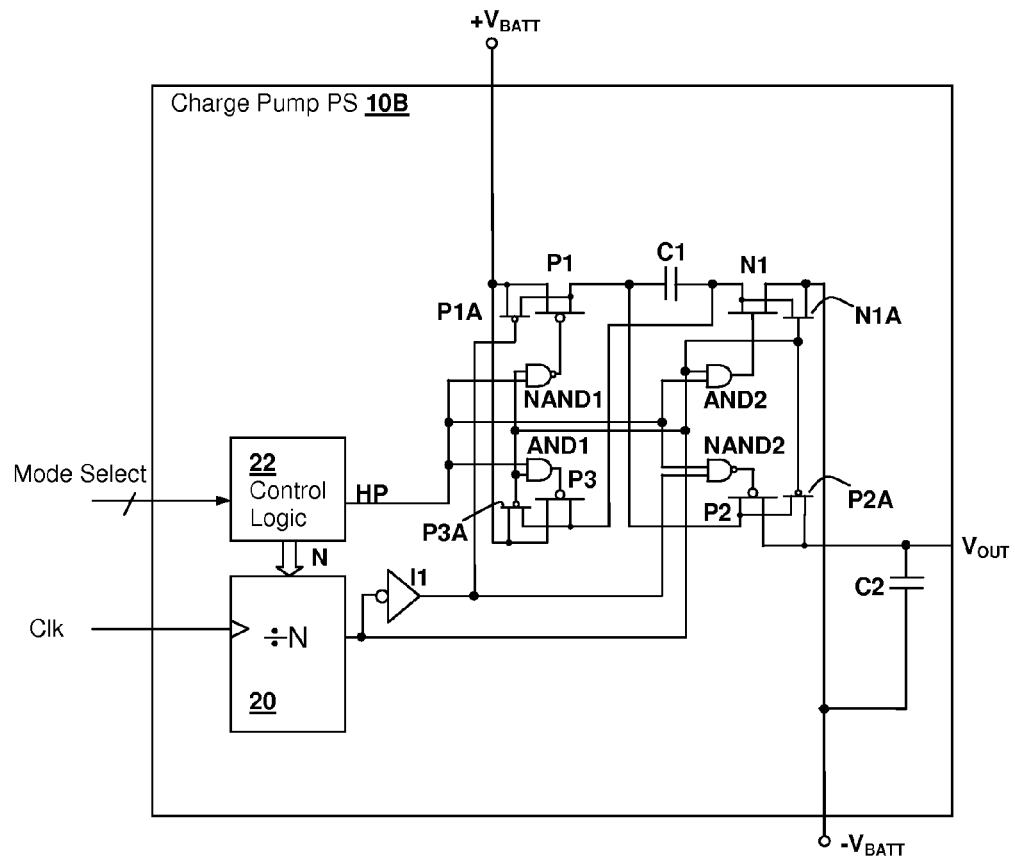
FIG. 3 is a schematic diagram depicting a charge-pump power supply 10B that may be used to implement charge-pump power supply 10 of FIG. 1, in accordance with an embodiment of the invention.

Referring now to FIG. 3, a schematic diagram of a charge pump power supply 10B that may alternatively be used to implement charge pump power supply 10 of FIG. 1 is shown. Charge pump power supply 10B is similar to charge pump power supply 10A of FIG. 2 as described above, so only differences between them will be described below. Each of switching transistors P1, P2, P3 and N1 has a corresponding smaller area switching transistor P1A, P2A, P3A or N1A having a drain-source connection connected in parallel with the corresponding switching transistor P1, P2, P3 or N1. The gates of smaller area switching transistors P1A, P2A, P3A and N1A are controlled by the same clock phase signals described above with respect to FIG. 2 and are operated continuously when charge pump power supply 10B is operating. Switching transistors P1, P2, P3 and N1 are operated only when a high power mode signal HP is asserted by control logic 22, by masking clock phase outputs of frequency divider 20 and inverter I1 using logical-AND gates AND1 and AND2 along with logical-NAND gates NAND1 and NAND2. The resulting operation reduces the effective gate capacitance of the switching transistors in charge pump power supply 10B when control signal HP is de-asserted, since the gate capacitances of switching transistors P1, P2, P3 and N1 are not being charged and discharged in the resulting high efficiency mode.

In the exemplary embodiment of FIG. 3, the frequency of operation of charge pump power supply 10B is also altered according to mode select signal(s) Mode Select, but that is not a requirement of the present embodiment, as the efficiency of charge pump power supply 10B can be improved for low amplitude amplifier output signals by reduction of effective gate capacitance alone. Therefore, frequency divider 20 is not required to implement a charge pump power supply according to the present invention. Mode select signal Mode Select, in each of the embodiments described above may be a multi-bit signal that indicates different ranges of actual or expected amplitudes of the signal at amplifier output Audio Out, and may therefore select from among multiple charge pump switching frequencies in charge pump power supplies 10A and 10B of FIG. 2 and FIG. 3, respectively. Further, in charge pump power supply 10B of FIG. 3, a multi-bit mode select signal may be used to select from among combinations of switching frequency and two or more active sets of parallel-connected switching transistors, as the switching transistor effective area/gate capacitance technique as depicted in FIG. 3 may be extended to parallel sets of switching transistors of any number, with appropriate clock control logic to enable and disable the control of the gates of the different sets of switching transistors. Further, the switching transistor sets may be mutually-exclusive, so that for example, small area switching transistors P1A, P2A, P3A and N1A could be disabled while larger area switching transistors P1, P2, P3 and N1 are actively switched.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. An audio amplifier circuit for providing an output signal to an audio transducer, the audio amplifier circuit comprising:
    a power amplifier having an audio input for receiving an audio input signal, an audio output for providing the output signal, and a pair of power supply rail connections;
    a charge pump power supply for providing a power supply voltage across the pair of power supply rail connections of the power amplifier and including at least one switching device, wherein the charge pump power supply has a selectable operating mode selectable between a high efficiency operating mode and a high power operating mode, wherein power consumed in charging and discharging a gate of the at least one switching device is lower in the high efficiency operating mode than in the higher power mode; and
    a control circuit for selecting the operating mode of the charge pump power supply in conformity with an indication of an amplitude of the audio output signal, such that the charge pump power supply operates in a high efficiency operating mode for lower amplitude audio output signals and a high power operating mode for higher amplitude audio output signals.

2. The audio amplifier circuit of claim 1, wherein the control circuit selects a frequency of operation of the charge pump power supply in conformity with the indication of the amplitude of the audio output signal, wherein the charge pump power supply has a lower switching frequency in the high efficiency operating mode and a higher switching frequency in the high power operating mode, whereby a rate of charging and discharging the gate of the at least one switching device is lowered in the high efficiency operating mode to reduce an internal power consumption of the charge pump power supply.

3. The audio amplifier circuit of claim 1, wherein the at least one switching device comprises at least two switching devices, and wherein the control circuit selectively disables charging and discharging of the gate of a given one of the at least two switching devices in conformity with the indication of the amplitude of the audio output signal, wherein the charging and discharging of the gate of the given switching device is disabled in the high efficiency operating mode and enabled in the high power operating mode, whereby a total switching gate capacitance among the at least two switching devices is reduced in the high efficiency operating mode to reduce an internal power consumption of the charge pump power supply.

4. The audio amplifier circuit of claim 1, wherein the control circuit selects the operating mode of the charge pump power supply in conformity with a volume setting of the audio amplifier circuit.

5. The audio amplifier circuit of claim 1, further comprising a gain control block coupled to the audio input for controlling an amplitude of audio output signal, and wherein the control circuit selects the amplitude in conformity with a control level of the gain control block.

6. The audio amplifier of claim 5, wherein the gain control block is a digitally controlled gain element, and wherein the control level is determined from a digital control value supplied to the digitally controlled gain element.

7. The audio amplifier circuit of claim 1, wherein the control circuit selects the operating mode in conformity with an amplitude of the audio input signal.

8. The audio amplifier circuit of claim 7, wherein the control circuit comprises a signal level detector for generating the indication of the amplitude of the audio output signal by detecting an amplitude of the audio input signal.

9. A method of improving efficiency of an audio amplifier for providing a power output to an audio transducer, the method comprising:
    receiving an indication of an amplitude of an audio output signal to be generated by the audio amplifier from an audio input signal;
    supplying a power supply voltage to the amplifier from a charge pump power supply, wherein power consumed in charging and discharging a gate of at least one switching device of the charge pump power supply is lower in the high efficiency operating mode than in the higher power mode; and
    selecting an operating mode of a charge pump power supply in conformity with the indication of the amplitude of the audio output signal.

10. The method of claim 9, wherein the selecting selects a frequency of operation of the charge pump power supply in conformity with the indication of the amplitude of the audio output signal, wherein the charge pump power supply has a lower switching frequency in the high efficiency operating mode and a higher switching frequency in the high power operating mode, whereby a rate of charging and discharging the gate of the at least one switching device of the charge pump power supply is lowered in the high efficiency operating mode to reduce an internal power consumption of the charge pump power supply.

11. The method of claim 9, wherein the at least one switching device comprises at least two switching devices, and wherein the selecting selectively disables charging and discharging of the gate of a given one of the at least two switching devices in conformity with the indication of the amplitude of the audio output signal, wherein the charging and discharging of the gate of the given switching device is disabled in the high efficiency operating mode and enabled in the high power operating mode, whereby a total switching gate capacitance among the at least two switching devices is reduced in the high efficiency operating mode to reduce an internal power consumption of the charge pump power supply.

12. The method of claim 9, wherein the receiving receives a volume setting of the audio amplifier, and wherein the selecting selects the operating mode of the charge pump power supply in conformity with the volume setting.

13. The method of claim 9, further comprising controlling an amplitude of the audio output signal of the amplifier according to a control level, and wherein the selecting selects the amplitude in conformity with the control level.

14. The method of claim 13, wherein the controlling is performed by a digitally controlled gain element, and wherein the control level is determined from a digital control value supplied to the digitally controlled gain element.

15. The method of claim 9, wherein the selecting selects the operating mode in conformity with an amplitude of the audio input signal.

16. The method of claim 15, further comprising:
detecting an amplitude of the audio input signal; and
determining the indication of the magnitude of the audio output signal from a result of the detecting.

17. An integrated circuit for providing an audio power output signal to a transducer, comprising:
a power amplifier having an audio input for receiving an audio input signal, an audio output for providing the output signal, and a pair of power supply rail connections;
a charge pump power supply for providing a power supply voltage across the pair of power supply rail connections of the power amplifier and including at least one switching device, wherein the charge pump power supply has a selectable operating mode selectable between a high efficiency operating mode and a high power operating mode, wherein power consumed in charging and discharging a gate of the at least one switching device is lower in the high efficiency operating mode than in the higher power mode; and
a control circuit for selecting the operating mode of the charge pump power supply in conformity with an indication of an amplitude of the audio output signal, such that the charge pump power supply operates in a high efficiency operating mode for lower amplitude audio output signals and a high power operating mode for higher amplitude audio output signals.

18. The integrated circuit of claim 17, wherein the control circuit selects a frequency of operation of the charge pump power supply in conformity with the indication of the amplitude of the audio output signal, wherein the charge pump power supply has a lower switching frequency in the high efficiency operating mode and a higher switching frequency in the high power operating mode, whereby a rate of charging and discharging the gate of the at least one switching device is lowered in the high efficiency operating mode to reduce an internal power consumption of the charge pump power supply.

19. The integrated circuit of claim 18, wherein the at least one switching device comprises at least two switching devices, and wherein the control circuit selectively disables charging and discharging of the gate of a given one of the at least two switching devices in conformity with the indication of the amplitude of the audio output signal, wherein the charging and discharging of the gate of the given switching device is disabled in the high efficiency operating mode and enabled in the high power operating mode, whereby a total switching gate capacitance among the at least two switching devices is reduced in the high efficiency operating mode to reduce an internal power consumption of the charge pump power supply.

20. The integrated circuit of claim 17, further comprising a gain control block coupled to the audio input for controlling an amplitude of audio output signal, and wherein the control circuit selects the amplitude in conformity with a control level of the gain control block.

* * * * *